(12) United States Patent
Braune et al.

(10) Patent No.: US 7,974,018 B2
(45) Date of Patent: Jul. 5, 2011

(54) OPTICAL ELEMENT, PRODUCTION METHOD THEREFOR, AND COMPOSITE COMPONENT PROVIDED WITH AN OPTICAL ELEMENT

(75) Inventors: Bert Braune, Wenzenbach (DE); Simon Blümel, Schierling (DE); Manfred Wolf, Kirchroth (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 99 days.

(21) Appl. No.: 12/086,383

(22) PCT Filed: Nov. 6, 2006

(86) PCT No.: PCT/DE2006/001947
§ 371 (c)(1),
(2), (4) Date: Feb. 17, 2009

(87) PCT Pub. No.: WO2007/076737
PCT Pub. Date: Jul. 12, 2007

(65) Prior Publication Data
US 2009/0213469 A1 Aug. 27, 2009

(30) Foreign Application Priority Data

Dec. 9, 2005 (DE) .......................... 10 2005 058 902
Mar. 8, 2006 (DE) .......................... 10 2006 010 729

(51) Int. Cl.
*G02B 1/00* (2006.01)
(52) U.S. Cl. ........................................ 359/796; 359/642
(58) Field of Classification Search .................. 359/642, 359/741, 754–797
See application file for complete search history.

(56) References Cited

U.S. PATENT DOCUMENTS

| | | | |
|---|---|---|---|
| 5,444,520 A | 8/1995 | Murano | |
| 5,615,052 A * | 3/1997 | Doggett | 359/811 |
| 6,165,393 A | 12/2000 | Nonogaki et al. | |
| 6,238,600 B1 * | 5/2001 | Kuo et al. | 264/1.7 |
| 6,527,411 B1 | 3/2003 | Sayers | |
| 6,598,998 B2 | 7/2003 | West et al. | |
| 6,800,373 B2 | 10/2004 | Gorczyca | |
| 6,872,635 B2 | 3/2005 | Hayashi et al. | |
| 7,193,299 B2 | 3/2007 | Arndt et al. | |
| 7,391,153 B2 | 6/2008 | Suehiro et al. | |
| 2001/0006219 A1 | 7/2001 | Kawai et al. | |
| 2004/0075100 A1 | 4/2004 | Bogner et al. | |
| 2004/0104488 A1 | 6/2004 | Tao et al. | |
| 2005/0107118 A1 | 5/2005 | Makino | |
| 2005/0179805 A1 | 8/2005 | Avron | |
| 2007/0274636 A1 | 11/2007 | Blumel | |
| 2008/0074762 A1 * | 3/2008 | Minakata et al. | 359/794 |

FOREIGN PATENT DOCUMENTS

| | | |
|---|---|---|
| CN | 1577909 | 2/2005 |
| CN | 1643899 | 7/2005 |
| DE | 102 14 119 | 10/2003 |
| DE | 10 2004 019 973 | 9/2005 |

(Continued)

*Primary Examiner* — Darry J Collins
(74) *Attorney, Agent, or Firm* — Cohen Pontani Lieberman & Pavane LLP

(57) ABSTRACT

An optical element (14) is specified which is suitable for an optoelectronic component and has a carrier part (1) and a beam shaping part (12), wherein the beam shaping part is molded onto the carrier part, or vice versa. A corresponding production method and a composite device comprising the optical element are furthermore specified.

39 Claims, 7 Drawing Sheets

FOREIGN PATENT DOCUMENTS

| | | |
|---|---|---|
| EP | 0 407 585 | 7/1989 |
| EP | 1 408 087 | 4/2004 |
| EP | 2 139 051 | 12/2009 |
| JP | 57-72108 | 5/1982 |
| JP | 60 175225 | 9/1985 |
| TW | 541726 | 7/2003 |
| TW | 571447 | 1/2004 |
| WO | WO 02/084749 | 10/2002 |
| WO | WO 2004/068447 | 8/2004 |
| WO | WO 2005/064626 | 7/2005 |
| WO | WO 2005/076376 | 8/2005 |

* cited by examiner

OPTICAL ELEMENT, PRODUCTION METHOD THEREFOR, AND COMPOSITE COMPONENT PROVIDED WITH AN OPTICAL ELEMENT

RELATED APPLICATIONS

This is a U.S. national stage of application No. PCT/DE2006/001947, filed on 6 Nov. 2006.

This application claims the priority of German applications no. 10 2005 058 902.2 filed Dec. 9, 2005 and no. 10 2006 010 729.2 filed Mar. 8, 2006, the entire content of both of which is hereby incorporated by reference.

FIELD OF THE INVENTION

The present invention relates to an optical element, a method for producing an optical element, and a composite device comprising an optical element.

SUMMARY OF THE INVENTION

It is an object of the present invention to provide a mechanically stabilized and reliably beam-shaping optical element, in particular a miniaturized optical element. Another object is to provide a method for producing an optical element of this type and a composite device comprising the optical element.

These and other objects are attained in accordance with one aspect of the present invention directed to an optical element, suitable for an optoelectronic component, comprising a carrier part and a beam shaping part, wherein the beam shaping part is molded onto the carrier part, or vice versa.

In accordance with at least one embodiment, the optical element is suitable for an optoelectronic component. In particular, the optical element is preferably formed for fixing to an optoelectronic component. Optoelectronic components generally have comparatively small dimensions, such that an optical element to be fixed to an optoelectronic component is to be produced in a manner coordinated with the component and in particular preferably in miniaturized fashion. The optoelectronic component preferably has an optoelectronic semiconductor chip, which is particularly preferably formed for generating radiation and/or for receiving radiation.

In accordance with at least one further embodiment, the optical element is fixed to the optoelectronic component.

In accordance with at least one further embodiment, the optical element has a carrier part and/or a beam shaping part.

The beam shaping part is expediently coordinated with the desired beam shaping properties of the optical element. In particular, the emission characteristic of a composite device comprising the optoelectronic component and the optical element can be shaped in accordance with a predetermined emission characteristic by means of the beam shaping part.

By means of the carrier part, the beam shaping part is preferably mechanically stabilized and/or the carrier part is formed for fixing the optical element to the optoelectronic component by means of the carrier part. In particular, the optical element, preferably, can be fixed or is fixed to the optoelectronic component by means of the carrier part. The carrier part preferably does not serve for beam shaping but rather is optimized toward mechanical properties and not toward optical properties.

In accordance with at least one embodiment, the beam shaping part is molded onto the carrier part or the carrier part is molded onto the beam shaping part. Accordingly, the carrier part and the beam shaping part are preferably molded successively. These parts can therefore be formed in a manner optimized toward different functions in simplified fashion. The carrier part is preferably optimized toward mechanical stability, in particular temperature stability and/or strength. The beam shaping part is preferably formed with regard to the radiation shaping properties and/or radiation stability, in particular with respect to short-wave, for instance ultraviolet or blue, high-energy radiation. Advantageously, a radiation-stable beam shaping part does not significantly change the optical properties—even upon irradiation with high-energy radiation over a critical period of time. Radiation-dictated turbidity or deformations of the beam shaping part can thus be reduced.

In accordance with at least one embodiment, the beam shaping part and the carrier part contain mutually different materials. Materials optimized for the respective function of the carrier part or of the beam shaping part are expediently used in this case. Since the carrier part and the beam shaping part can be molded onto one another, the degrees of freedom in the selection of the materials are advantageously increased. Thus, for example the carrier part can be formed in radiation-opaque fashion, for example from a material that is radiation-opaque to a radiation to be received and/or to be emitted by the optoelectronic component.

In this way, it is possible to form a miniaturized optical element for an optoelectronic component in a simplified manner at the same time mechanically stably and reliably durably in a beam-shaping manner. Furthermore, the carrier part can mechanically stabilize the beam shaping part. This is particularly advantageous if the beam shaping part is formed from a flexible, easily bendable or extensible material. In this case, the carrier part is expediently formed in deformable fashion, in particular in bendable or extensible fashion, with greater expenditure of force by comparison with the beam shaping part.

In accordance with at least one embodiment, the carrier part and the beam shaping part are mechanically stably connected to one another. In particular, an intimate mechanical connection can be formed between said parts. Additional adhesion promoters, for instance an adhesive, for fixing the carrier part and the beam shaping part to one another, can be dispensed with. Rather, the beam shaping part and the carrier part can be molded onto one another in such a way that a mechanically stable connection is formed during the molding-on process.

In accordance with at least one embodiment, the beam shaping part and the carrier part are formed from mutually different basic materials, in particular basic molding compounds. The basic materials can contain, if appropriate, identical additives in small amounts. Preferably, however, the basic materials have different main constituents that determine the expediently different physical properties of the carrier part or of the beam shaping part.

In accordance with at least one embodiment, the carrier part and the beam shaping part contain different plastics. By comparison with an optical element containing glass, for example, plastics can be processed in a comparatively cost-effective and simplified manner.

In accordance with at least one embodiment, the carrier part contains a thermoplastic or a thermosetting plastic. Materials of this type are distinguished by an advantageously high mechanical stability. However, thermoplastics or thermosetting plastics available for a thermostable carrier part are generally radiation-opaque, in particular from the infrared through the visible into the ultraviolet spectral range, such that they are therefor essentially unsuitable for beam shaping. In case of doubt, a thermostable material should be regarded as one which is essentially dimensionally stable at temperatures of greater than or equal to 250° C., preferably over a period of time of 10 s or more, for instance up to 20 s. Preferably, the material is essentially dimensionally stable with respect to a temperature ramp that is led up to 250° C. or up to 260° C. in a time period of 100 s or more, in particular up to 120 s. Particularly preferably, the material is essentially dimensionally stable at temperatures of greater than or equal to 250° C. over a time period of 100 s or more, for instance up to 120 s.

In accordance with at least one embodiment, the beam shaping part contains a silicone, a hybrid material, in particular a silicone hybrid material. Materials of this type are particularly suitable for beam shaping and, in particular with regard to the optical properties, are resistant to a permanent effect of short-wave radiation, for instance ultraviolet or blue radiation. However, beam shaping parts containing materials of this type are comparatively easily bendable and flexible, such that they are suitable only to a limited extent for the, in particular positionally stable, fixing of the optical element to an optoelectronic device. In the case of hybrid materials, that is to say materials comprising mutually different components, the mechanical properties can be influenced to a limited extent by the choice of the components.

Silicone hybrid materials, containing for instance a silicone and a reaction resin, for example an epoxy resin, generally have a higher adhesion capability than a molded part containing a non-hybridized silicone. On account of the increased adhesion, a silicone hybrid material can be molded onto another element, e.g. the carrier part, in a simplified manner with the formation of a mechanically particularly stable bond. The chemical adhesion properties of a hybrid may in particular be similar to those of an epoxy material, e.g. of an epoxy resin. However, a silicone material is generally more cost-effective than a hybrid material, even a silicone hybrid material.

Another aspect of the present invention is directed to a method for producing an optical element wherein the method comprises the steps of producing a molded body for the carrier part or beam shaping part, and molding a further molded body for the beam shaping part or the carrier part, respectively, onto the molded body produced first.

In at least one embodiment of the method for producing an optical element having a carrier part and a beam shaping part, firstly a molded body for the carrier part or the beam shaping part is molded and/or produced. The molded body is preferably produced by means of molding, in particular injection molding. For this purpose, a molding compound for the molded body can be filled, in particular injected, into a suitable mold, in particular an injection mold. A plastic molding compound is preferably used. Furthermore, the molding compound is preferably subsequently incipiently or fully cured or hardened in some other way and a molded body is thus produced.

A further molded body for the beam shaping part or the carrier part, respectively, is thereupon molded onto the molded body produced first. Preferably, a molding compound for the further molded body is molded, in particular injection-molded, onto the molded body produced first. A different molding compound than the molding compound used previously, in particular a plastic molding compound, is particularly suitable for this.

Accordingly, the optical element is preferably produced by means of a multicomponent molding method in which, if appropriate different, molding compounds are processed temporally separately from one another for a composite molded body. The molding of different molding compounds onto one another is thus facilitated. The molding method is preferably a two-component injection-molding method (2C injection molding).

Such a molding method, in particular an injection-molding method, is particularly suitable for the industrial manufacture of miniaturized optical elements, the respective carrier parts and beam shaping parts of which are optimized toward different functions, in high numbers.

In accordance with at least one embodiment of the method, the two molded bodies are produced in a common die or more particularly a mold, for example an injection mold. For this purpose, a corresponding mold can firstly be partly filled with a molding compound for one molded body. A further molding compound for the other molded body can subsequently be filled into the common mold whilst being molded onto the molding compound filled in first. Preferably, the molding compound filled in first is incipiently or fully cured before the further molding compound is filled in, thereby facilitating molding of the further molding compound onto the molded body that has been formed or is to be formed by means of the molding compound filled in first.

In accordance with at least one further embodiment of the method, the molded body produced first is removed from the corresponding mold for the molding of the further molded body and is transferred into a further die or more particularly a mold, for example an injection mold, for the further molded body. For this purpose, the molded body produced first, preferably in the first mold, is expediently firstly incipiently or fully cured, thereby reducing the risk of deformation of said molded body during transfer.

The further molded body can be shaped, in particular molded and/or injection-molded, onto the molded body produced first.

In accordance with at least one further embodiment of the method, the beam shaping part is molded onto the carrier part, and not vice versa. The formation of a mechanically stable connection between the beam shaping part and the carrier part is thus facilitated since the, preferably fully cured, carrier part can in this case have, in a simplified manner, a strength that fosters a mechanically stably formed mechanical connection.

In accordance with at least one embodiment of the method, a molding compound for the beam shaping part that is molded onto the, preferably fully cured, carrier part is incipiently or fully cured after molding, wherein the molding compound shrinks onto the carrier part during curing in such a way that a mechanically stable connection between the carrier part and the beam shaping part is formed after curing. The beam shaping part may be under tensile stress, in particular, after curing. The mechanical stability of the beam shaping part with respect to deformation during mechanical loading of the beam shaping part is thus increased.

After the further molded body has been molded onto the molded body molded first and, if appropriate, after subsequent incipient or full curing, the optical element can be removed from the mold.

The method described is particularly suitable for producing optical elements for optoelectronic devices since, by means of the method, optical elements specifically coordinated with optoelectronic devices can be reliably manufactured in high numbers and with a small structural size. The features described further above and below for the optical element and the optoelectronic component, respectively, can accordingly also be used for the method, and vice versa.

In accordance with at least one further embodiment, the optical element has a connecting element or a plurality of connecting elements formed at or in the carrier part, wherein the beam shaping part at least partly molds around the connecting element or the connecting elements, is molded into the connecting element or the connecting elements and/or is molded through the connecting element or the connecting elements.

Preferably, the connecting element or the connecting elements is or are formed as elevation, depression or cutout.

An elevation is particularly suitable for molding around. As a result of molding around an elevation, the contact area between the beam shaping part and the carrier part is enlarged, thereby promoting the stability of the mechanical connection. A depression is particularly suitable for the molding-in process. The contact area between the beam shaping part and the carrier part is likewise enlarged as a result of this. A cutout is particularly suitable for the molding-through process. Particularly preferably, the material of the beam shaping part that is molded through the cutout extends, in particular completely, through the cutout and the carrier part and preferably has, on two sides of the cutout, a lateral extent greater than that of the cutout. As a result of this, a rivet-like, mechanically particularly stable connection between the carrier part and the beam shaping part can be formed, in particular on a side of the carrier part that is remote from a beam shaping surface of the beam shaping part. The elevation, the depression and/or the cutout can be undercut, if appropriate. The stability of the connection can thus be increased more extensively.

In accordance with at least one further embodiment, the carrier part is embodied in frame-like fashion. In the carrier part, in particular a, preferably centrally arranged, aperture in which the carrier frame is cut out is then formed for the passage of radiation. The use of a radiation-opaque material for the carrier part is thus facilitated without impairing the beam shaping at the beam shaping part or the radiation entrance or exit for the optoelectronic component. The beam shaping part covers the aperture of the carrier frame preferably, in particular completely, in a lateral direction. The beam shaping part can in particular span the aperture. As a result of this, the passage of radiation through the carrier part and efficient, large-area beam shaping at the optical element are achieved in a simplified manner.

In a further preferred configuration, the beam shaping part is embodied in lens-like fashion.

In accordance with a further embodiment, a surface of the beam shaping part has a concavely curved partial region and a convexly curved partial region. Preferably, the convexly curved partial region surrounds the concavely curved partial region in a lateral direction. Particularly preferably, the convexly curved partial region runs around the concavely curved partial region laterally, in particular completely. The optical element can be embodied in particular in such a way that beam shaping is effected, in particular by means of refraction, essentially only at the surface of the radiation shaping part with the curved partial regions. The beam shaping can thus be effected particularly reliably. Particularly preferably, the surface with the curved partial regions is formed on a side of the beam shaping part that is remote from the optoelectronic component. Furthermore, an optical axis of the optical element fixed to the optoelectronic component preferably runs through the concavely curved partial region and/or the optoelectronic semiconductor chip of the optoelectronic component. The optical axis can in particular run essentially perpendicular to a surface of the optoelectronic semiconductor chip that faces the beam shaping part. The surface with the curved partial regions is preferably embodied rotationally symmetrically with respect to the optical axis.

For an optoelectronic component, a homogeneous, wide-angle emission or reception characteristic of the component obliquely with respect to the optical axis can be achieved in a simplified manner by means of such shaping. A maximum of the emitted radiation power can lie e.g. at a comparatively large angle with respect to the optical axis, in particular greater than 60°. This facilitates homogeneous illumination of an area to be illuminated, in particular running perpendicular to the optical axis, at a small distance from the semiconductor chip. Furthermore, such shaping of the beam shaping part makes it possible to obtain a particularly homogeneous local irradiance distribution—watts of the radiation power impinging on the area relative to the content of the illuminated area in $m^2$—on the area to be illuminated. By means of the concavely curved and the convexly curved partial regions, the radiation can essentially be refracted away from the optical axis, whereby the region illuminated on the area to be illuminated can be enlarged. The optoelectronic component with the fixed optical element, as a composite device, in the case of a partial area to be illuminated and having a predetermined size, can thus be arranged, in a simplified manner, closer to the, preferably planar, area to be illuminated and is therefor particularly suitable for forming a compact illumination device.

The optoelectronic component with the fixed optical element is thus particularly suitable for backlighting for a display device to be formed in compact fashion, in particular a liquid crystal display (LCD) device. In this case, the optoelectronic component is expediently embodied for generating visible light.

The optical element mounted at the optoelectronic component is preferably formed in such a way that the composite comprising the optoelectronic component and the optical element, as a composite device, can be mounted by means of soldering mounting, for example on a printed circuit board. During soldering, the optical properties of the beam shaping part, for example the transmission or the beam shaping properties, and the mechanical stability of the carrier part and by way of this in particular the stability of the fixing to the optoelectronic device are not crucially impaired. The use of different materials for the carrier part and the beam shaping part of the optical element makes it possible to obtain reliable solderability of the composite device in a simplified manner without significant damage.

The composite device can be mounted in particular by means of lead-free soldering mounting using a lead-free solder. At the soldering temperatures generally required for this purpose of 250° C. or higher and in particular up to 260° C., with a soldering duration of 100 s or more, in particular up to 120 s, the optical element is advantageously stable. In this case, the maximum soldering temperature, e.g. 250° C. to 260° C., is generally achieved by means of a temperature ramp, e.g. with a duration of between 100 s and 120 s, wherein the maximum temperature is preferably held for 10 s or more, in particular up to 20 s.

During soldering mounting, the carrier part is preferably stable with respect to deformations and the beam shaping part is preferably stable with respect to deformations and in particular with respect to degradation of the optical properties. In this case, a thermoplastic or a thermosetting plastic is particularly suitable for the carrier part and a silicone or a silicone hybrid material is particularly suitable for the beam shaping part. An optical element in which different materials are used for the carrier part and the beam shaping part facilitates the formation of a reliably lead-free-solderable composite device comprising the optical element and the optoelectronic component.

In accordance with at least one embodiment, the optoelectronic component is formed as a surface-mountable component. Surface mounting technology facilitates the mounting of the optoelectronic component and in particular the mounting of a plurality of densely packed optoelectronic components on a carrier element, e.g. a printed circuit board. The optoelectronic component is preferably embodied as an LED component.

In accordance with at least one further embodiment, the optical element is formed as attachment optic, in particular as slip-over optic or plug-on optic, for attachment, in particular slipping over or plugging on, onto an optoelectronic component.

A plug-on optic should be understood in this case to mean an optical element which engages into mounting devices of the optoelectronic device and preferably has suitable fixing elements for this purpose.

A slip-over optic can be fixed to the optoelectronic component without any engagement and/or without any latching connections. In particular, specific elements for fixing, for instance the formation of mounting devices in the optoelectronic component, are not necessary in the case of a slip-over optic.

In accordance with at least one further embodiment, the optoelectronic component has a housing body with a radiation passage area, wherein the optical element preferably can be fixed or is fixed to the housing body. The optical element is preferably fixed to the housing body by means of the carrier part.

The housing body advantageously protects the semiconductor chip of the component against harmful external influences and against mechanical loads. The semiconductor chip can for example be arranged in a cavity of the housing body and, if appropriate, be electrically conductively connected to electrical connection conductors of the component. The housing body is preferably embodied as a premolded housing body, onto which the semiconductor chip is mounted and electrically conductively connected to the connection conductors. Furthermore, the semiconductor chip is preferably embedded into an encapsulation, for example containing a silicone or a silicone hybrid material, said encapsulation preferably being arranged in the cavity. The encapsulation advantageously protects the semiconductor chip against external harmful influences, for instance moisture.

In accordance with at least one further embodiment, the carrier part and the housing body contain materials that are matched to one another with regard to the coefficients of thermal expansion. For this purpose, the coefficients of thermal expansion of the carrier part and of the housing body deviate from one another preferably by 10% or less, particularly preferably 5% or less. The risk of a reduction of the stability of the fixing of the optical element to the housing body at high temperatures, such as during soldering, for instance, is considerably reduced by the matching of the coefficients of thermal expansion. Such matching of the expansion coefficients reduces or largely prevents mechanical stresses between the optical element and the optoelectronic component in the case of temperature fluctuations. An increased overall stability of a composite device is therefor obtained. Preferably, the carrier part and the housing body contain an identical material, in particular an identical basic molding compound, or a corresponding or an identical material composition.

In accordance with a further embodiment, one or a plurality of fixing elements is or are formed at or in the carrier part, wherein the optoelectronic component, in particular the housing body, has one or a plurality of mounting devices which correspond to the fixing elements and into which the fixing elements engage for fixing the optical element to the optoelectronic component. The fixing elements are preferably shaped at the carrier part. In particular, the carrier part can be embodied as an integral molded part. The mounting devices of the optoelectronic component can be embodied for example as recesses or cutouts in the housing body into which, for instance pin-like, fixing elements of the optical element can engage. By means of the fixing elements, the optical element plugged onto the component can be fixed to the optoelectronic device for example by means of an adhesive-bonding connection, press fit, hot press fit, thermal riveting, caulking or hot caulking. However, fixing of this type generally necessitates specially formed mounting devices at a component.

In accordance with at least one further embodiment, the carrier part engages over the housing body. Accordingly, it is possible that the optical element in particular can be slipped over the housing body or is slipped over the latter. The carrier part can furthermore, in particular completely, laterally run around the housing body. Fixing of the optical element to the component by means of the carrier part can thus advantageously be embodied over a large area. In particular, the housing body can be arranged within the carrier frame. Furthermore, the optical element is preferably embodied in such a way that the housing body can be introduced into the optical element. By means of such embodiments of the optical element, it is possible to form particularly simple, in particular latch-free and/or engagement-free, fixing of the optical element, in particular directly to the optoelectronic component. Comparatively complicated mounting devices, for instance for a plug connection, at the optoelectronic component can thus be dispensed with.

In accordance with at least one further embodiment, the carrier part is arranged or formed on that side of the optical element which faces the optoelectronic component.

In accordance with at least one further embodiment, the optical element is fixed to the optoelectronic component, in particular exclusively, by means of an adhesion promoter. Fixing elements specially shaped in the optical element in the above sense can thus be dispensed with.

In accordance with at least one further embodiment, the optical element can be fixed or is fixed, from outside the housing body, to a, in particular outermost, lateral area of the housing body that laterally delimits the housing body. In this case, the adhesion promoter is preferably arranged between the carrier part and the lateral area of the housing body and is particularly preferably in direct contact with the carrier part and the lateral area. In particular, the adhesion promoter can be arranged on opposite lateral areas of the housing body between the carrier part and the housing body. The adhesion promoter can furthermore be arranged at all lateral areas of the housing body or run around the housing body.

In accordance with at least one further embodiment, the adhesion promoter is arranged between the beam shaping part and the optoelectronic component. The area available for fixing the optical element can thus advantageously be enlarged. The mechanical stability of the fixing is thereby increased.

In accordance with at least one further embodiment, the adhesion promoter extends, in particular in a layer-like manner, along a surface of the housing body that faces the beam shaping part, and, proceeding from said surface, extends as far as and along the lateral area of the housing body. By means of an adhesion promoting layer of this type, a mechanically stable connection can also be formed in an edge region of that surface of the housing body which faces the beam shaping part and in the region of the lateral area by molding around the edge.

In accordance with at least one further embodiment, the adhesion promoter, proceeding from the radiation passage area of the housing body, extends, in particular continuously, as far as and along the lateral area. The adhesion promoting area can thus be enlarged.

In particular, the adhesion promoter, proceeding from a first lateral area, can extend as far as that surface of the optoelectronic device which faces the beam shaping part, along said surface over the radiation passage area of the housing body as far as the lateral area opposite the first lateral area, and along said lateral area. The adhesion promoter can in particular engage over the housing body. The stability of the fixing is thus increased.

In accordance with at least one further embodiment, a refractive index matching layer is arranged between the beam shaping part, in particular a radiation entrance or exit area of the beam shaping part, and the radiation passage area of the housing body. The refractive index matching layer expediently covers the radiation passage area of the housing body, in particular completely. Furthermore, the refractive index matching layer preferably adjoins the beam shaping part and/or the radiation passage area of the housing body. A sudden change in refractive index between the beam shaping part and the material arranged in the optoelectronic component on the part of the radiation passage area is expediently reduced by means of the refractive index matching layer.

Particularly advantageously, the adhesion promoter forms the refractive index matching layer. Beam shaping is effected in the beam shaping part preferably essentially by means of that surface of the beam shaping part which is remote from the optoelectronic component. By means of the refractive index matching, radiation that is generated or is to be received in the optoelectronic component can be shaped in a simplified manner essentially without optical influencing, for example via reflection or refraction, of the beam path outside the beam shaping part or said influencing can be reduced. The formation of a predetermined emission or reception characteristic for the composite device by means of the beam shaping part is thus facilitated.

In accordance with at least one further embodiment, the adhesion promoter contains a silicone, in particular a silicone gel, or a silicone hybrid material. Materials of this type are particularly suitable for the adhesion promoter with a refractive index matching effect at the same time. In particular, this holds true if the beam shaping part contains a silicone or a silicone hybrid material and the material arranged on the part of the radiation passage area of the optoelectronic component, for instance the chip encapsulation, likewise contains a silicone or silicone hybrid material.

Furthermore, the adhesion promoter preferably directly adjoins the optoelectronic component, the carrier part and/or the beam shaping part.

DETAILED DESCRIPTION OF THE DRAWINGS

Elements which are identical, of identical type and act identically are provided with identical reference symbols in the figures.

FIGS. 1A to 1D and 2A and 2B, respectively, show different views of a respective exemplary embodiment of a carrier part 1 for an optical element.

Figure 1A:
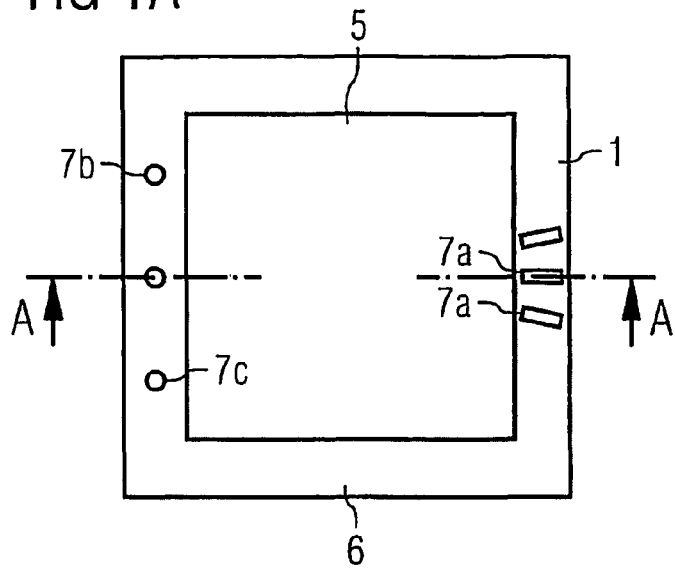
FIGS. 1A to 1D show different schematic views of an exemplary embodiment of a carrier part for an optical element.
Figure 1B:
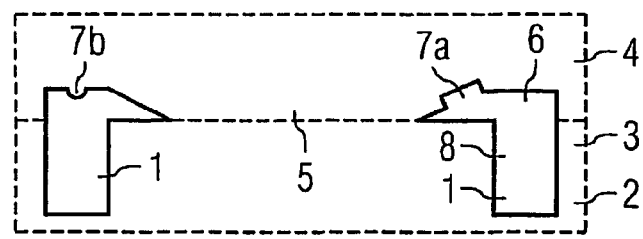
Figure 1C:
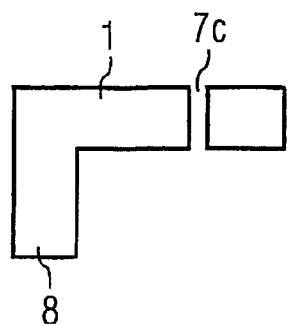
Figure 1D:
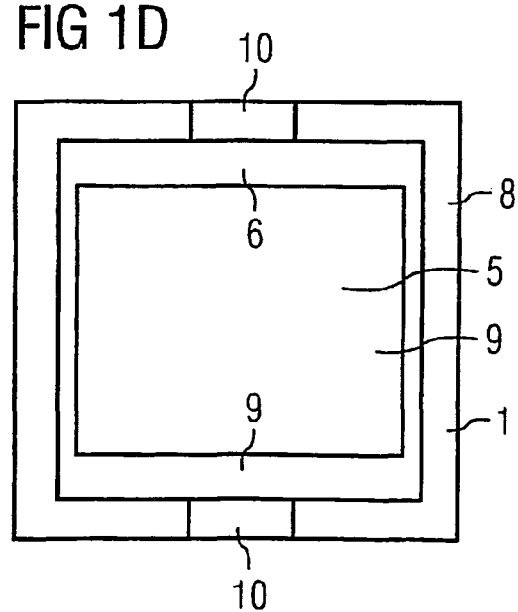

FIG. 1A shows a schematic plan view of the carrier part 1 from above, FIG. 1B shows a schematic sectional view along the line A-A from FIG. 1A, FIG. 1C shows a variant of the carrier part on the basis of a partial sectional view, and FIG. 1D shows a plan view of the carrier part from below.

Figure 2A:
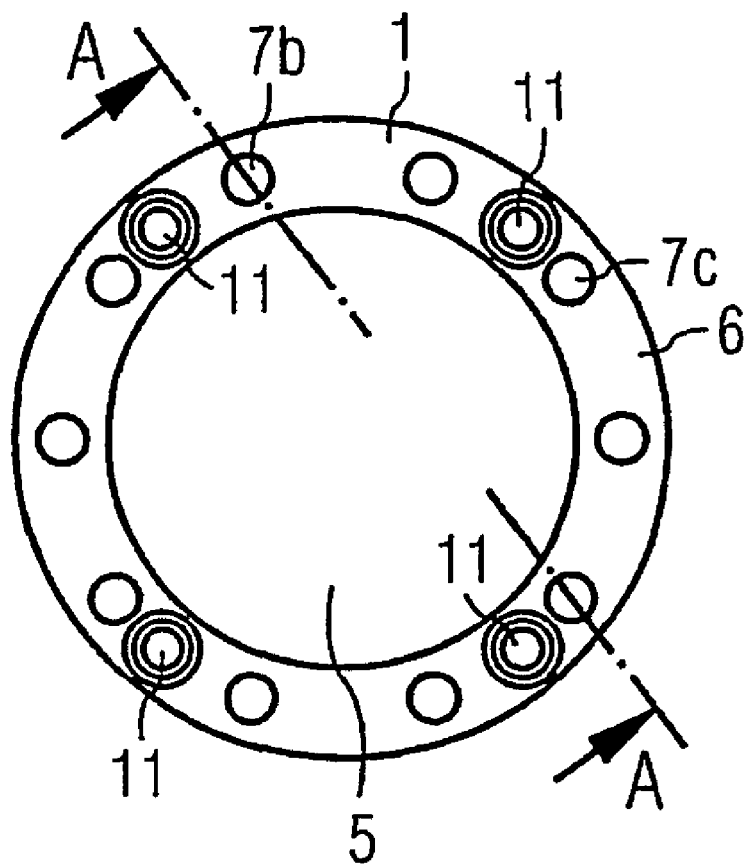
FIGS. 2A and 2B show different schematic views of a further exemplary embodiment of a carrier part for an optical element.
Figure 2B:
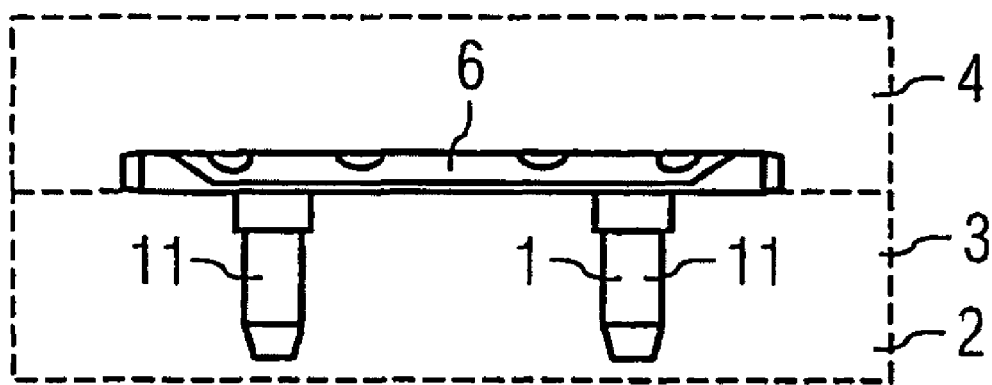

FIG. 2A shows a plan view of the carrier part 1 from above and FIG. 2B shows a schematic sectional view along the line A-A from FIG. 2A through the carrier part 1.

The carrier part 1 is preferably embodied in each case as an, in particular integral, molded part. The carrier part 1 furthermore preferably contains a plastic, for example a thermoplastic or a thermosetting plastic.

The carrier part 1 can be produced by means of molding, in particular by means of injection molding, in a suitable mold 2, for example an injection mold, which in the present case is merely indicated by dashed lines in the schematic sectional views in FIGS. 1B and 2B, respectively.

The mold 2 preferably has two partial molds 3 and 4, between which a cavity is formed for filling in, in particular injecting in, a molding compound for the carrier part. The cavity of the mold 2 is expediently shaped in accordance with the desired shape of the carrier part 1. After the molding compound has been filled into the mold, the molding compound is preferably incipiently or fully cured, whereupon the carrier part 1 can be removed from the mold. The respective partial molds 3 and 4 are preferably embodied without any undercuts, such that cost-intensive slides in the mold for the carrier part 1 can be dispensed with and the removal of the carrier part from the mold is facilitated.

The carrier part 1 is in each case formed in such a way that an optical element having the carrier part 1 and a beam shaping part to be molded onto the carrier part 1 can be fixed to an optoelectronic component, in particular a housing body of an optoelectronic component, by means of the carrier part (cf. the exemplary embodiments described in connection with the subsequent figures).

The material for the carrier part is preferably chosen with regard to high mechanical stability. Preferably, the carrier part 1 is produced from the material or a corresponding material composition from which the housing body of the optoelectronic component to which the optical element is to be fixed is produced. The risk of impairments of the mechanical stability of the fixing of the optical element to the optoelectronic component is crucially reduced on account of the then optimally matched coefficients of thermal expansion of the carrier part and of the housing body. A thermoplastic, e.g. a polyamide, in particular polyphthalamide (PPA), is often used in the case of housing bodies and is therefor also particularly suitable for the carrier part 1 with regard to mechanical stability and thermal matching. Moreover, the carrier part 1 can be formed from a material that is radiation-opaque to a radiation to be generated or to be received by the optoelectronic component, or from a corresponding material composition, e.g. containing PPA.

A plastic for the carrier part can be admixed with one or a plurality of different additives, e.g. particles, such as $TiO_2$ particles, and/or glass fibers. A plastic (e.g. a plastic having the trade name Grivory HT), such as PPA, admixed with $TiO_2$ particles and glass fibers is distinguished by particularly low radiation transmissivity, in particular for blue or white light, and is particularly stable with respect to high temperatures, which can occur e.g. during soldering, and is therefor particularly suitable for the carrier part, as explained in greater detail above and below.

The respective carrier part 1 has a molding-on part 6, which is provided for molding a beam shaping part for the optical element onto the carrier part 1. An aperture 5 is formed in the molding-on part 6, which is preferably embodied integrally and/or in frame-like fashion. The molding-on part 6 runs around the aperture 5 preferably laterally, in particular completely. Through the aperture, radiation can pass through the carrier part 1 embodied possibly in radiation-opaque fashion.

Connecting elements 7a, 7b or 7c can be formed in the molding-on part 6 of the respective carrier part. The respective connecting elements 7a, 7b and 7c are preferably formed in such a way that the direct contact area between the carrier part and the beam shaping part to be molded onto the latter is increased. The mechanical stability of the connection between the carrier part 1 and the beam shaping part can thereby be increased. The connecting element 7c is only illustrated in a partial sectional view of the carrier part.

The connecting elements are expediently formed at a surface of the molding-on part which faces the beam shaping part to be molded on. The connecting elements 7a are embodied as elevations, for example in ridge-like fashion. The connecting elements 7b are embodied as depressions, for example point-type depressions or, if appropriate, as a peripheral groove (not illustrated). The connecting elements 7c are embodied as, in particular point-like, cutouts. The connecting elements are in each case formed in the molding-on part 6. Elevations as connecting elements are not explicitly illustrated in FIG. 2 but can, of course, also be provided in the case of the carrier part 1 shown therein.

Furthermore, contrary to the illustration, it is also possible to provide a multiplicity of, in particular exclusively, type-identical connecting elements 7a, 7b and 7c, respectively. The illustration of different connecting elements at the carrier part in FIGS. 1 and 2 should be understood merely by way of example in this regard. The connecting elements are furthermore preferably—contrary to the exemplary illustration in FIG. 1—distributed uniformly, in particular equidistantly, over the carrier part 1, in particular the molding-on part 6. This laterally circumferentially increases the stability of a connection between the carrier part and the beam shaping part to be molded on.

The carrier parts 1 illustrated in FIGS. 1A to 1D and 2A to 2B differ in the type of fixing to the optoelectronic component for which the carrier part is provided.

The exemplary embodiment of the carrier part 1 as illustrated in FIGS. 1A to 1D is particularly suitable for an optical element which can be slipped over the housing body of an optoelectronic component or into which the optoelectronic component can be inserted. For this purpose, the carrier part has a fixing part 8, which is preferably adapted to the lateral dimensions of the component, in particular of a housing body of the component. The fixing part 8 is preferably embodied in frame-like fashion. A clearance 9, which the fixing part preferably at least partly laterally delimits or preferably runs around in particular completely, can have, for the slipping over or insertion, an enveloping basic form corresponding to that of the respective housing body of the optoelectronic component.

Preferably, the clearance 9 has a lateral extent that is larger than that of the aperture 5 in the molding-on part 6. The aperture 5 and the clearance 9 can have mutually different enveloping basic forms. The clearance 9 is preferably formed for the insertion or slipping over, the aperture 5 being provided for the passage of radiation. By way of example, the clearance 9 has an enveloping basic form which, in plan view, is rectangular, that is to say in particular is not square, having sides of different lengths. The aperture 5 can have a square enveloping basic form.

The cross section of the molding-on part 6 preferably tapers in a direction of the aperture 5, particularly preferably in such a way that the aperture widens in the direction of the surface onto which the beam shaping part is to be molded, that is to say in particular the surface remote from the fixing part 8. A large-area radiation passage of a wide beam bundle through the aperture is thus facilitated in conjunction with an enlarged surface available for molding on.

Recesses 10 are preferably formed in the fixing part 8, in particular at opposite sides. Through said recesses 10 it is possible to lead connection conductors of the optoelectronic component for the external electrical contact-connection of the inserted component toward the outside.

As an alternative or in addition, the recesses 10 can serve as alignment or orientation aids during the oriented attachment of the optical element onto the optoelectronic component. This is particularly advantageous if the component, in particular the housing body thereof, has in plan view a basic form with which the carrier part is coordinated and which, like a genuinely rectangular basic form, for instance, requires orientated attachment.

The exemplary embodiment of the carrier part 1 as illustrated in FIGS. 2A to 2B is particularly suitable for plugging the optical element onto the optoelectronic component. Preferably pin-like fixing elements 11 at the carrier part 1, which are suitable for engaging in corresponding mounting devices of the optoelectronic component, in particular the housing body thereof, are formed for this purpose. The fixing elements 11 are furthermore preferably embodied in beveled fashion at the side remote from the beam shaping part to be molded on. In the case where the optical element is attached onto the component in a manner slightly misaligned with respect to the mounting device, the fixing elements can thus be fed to the respectively corresponding mounting device in a simplified manner and in particular "slide" into the mounting device.

Figure 3:
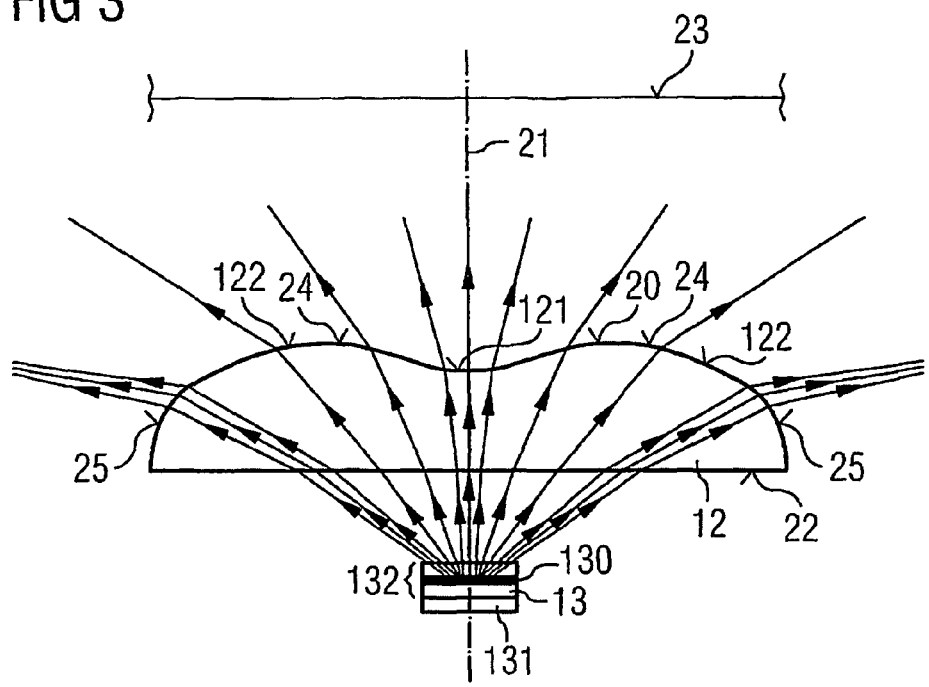
FIG. 3 shows a schematic sectional view of an exemplary embodiment of an arrangement comprising a beam shaping part for an optical element and a semiconductor chip.

FIG. 3 schematically shows a sectional view of a particular embodiment of a beam shaping part 12 for an optical element. Furthermore, the beam shaping properties of the beam shaping part are illustrated schematically on the basis of the beam path. In this case, an optoelectronic semiconductor chip 13 preferably serves as radiation source.

The beam shaping part preferably contains a silicone or a silicone hybrid material. These materials are essentially dimensionally stable and transmission-stable over a crucial duration even in the case of high-energy short-wave radiation, for instance ultraviolet or blue radiation, which can be generated by means of the semiconductor chip.

Silicones are generally very flexible and easily bendable. Furthermore, even small damage, e.g. a crack, in a silicone molded part can impair the overall stability of the molded part in such a way that the molded part is destroyed with little action of force.

Silicone hybrids, for instance containing a silicone and an epoxy resin, are radiation-stabler than an epoxy resin and exhibit a similar chemical adhesion behavior. In particular, hybrids generally adhere better than pure silicones. The degradation rate of the optical properties of a hybrid can be crucially above that of similar materials, e.g. of an epoxy resin. The degradation of hybrids can be slowed down in comparison with the degradation of optically comparable materials by 5-fold or more, in particular up to 1000-fold or beyond.

The beam shaping is illustrated merely by way of example for a radiation-emitting semiconductor chip. The beam path can be reversed, of course. In this case, the semiconductor chip is expediently embodied as a radiation detector chip.

A radiation exit area 20 of the beam shaping part 12 has a concavely curved partial region 121 and a convexly curved partial region 122, which surrounds, in particular completely runs around, the concavely curved partial region at a distance from the optical axis 21.

Radiation generated in an active zone 130 of the optoelectronic semiconductor chip 13 enters into the beam shaping part 12 via a radiation entrance area 22, which is preferable embodied in planar fashion. The radiation generated by the semiconductor chip, in particular visible radiation, is illustrated in FIG. 3 by the lines which are identified by arrows and which indicate the beam path on the basis of individual rays. The optical axis 21 runs through the semiconductor chip 13 and the concavely curved partial region.

The semiconductor chip 13 comprises a semiconductor body 132, which is arranged on a carrier 131 and which in turn comprises the active zone 130 suitable for generating radiation. A mirror layer can be arranged on that side of the active zone which is remote from the beam shaping part, e.g. between the carrier and the semiconductor body, said mirror layer directing radiation by reflection in the direction of that surface of the semiconductor chip which faces the beam shaping part. Preferably, the mirror layer is embodied in electrically conductive fashion, for instance in metal-containing fashion, e.g. containing a metal or an alloy. Preferably, the mirror layer is embodied in metallic or alloy-based fashion. The mirror layer is furthermore preferably electrically conductively connected to the active zone and can thus be involved in the electrical contact-connection of the chip in addition to the reflection in a simplified manner. In this case, the carrier is preferably different than a growth substrate on which a semiconductor layer sequence for the semiconductor body is grown epitaxially.

The arrangement comprising the beam shaping part 12 and the semiconductor chip 13 is particularly suitable for homogeneous illumination, in particular for backlighting of an area 23, for instance of a diffuser film or of a display device, such as an LCD. The optimal axis 21 preferably runs through the area 23. Particularly preferably, the area 23 runs essentially perpendicular to the optical axis 21.

Through suitable formation of the curvatures of the convexly curved and concavely curved partial regions, the radiation generated by the semiconductor chip can be distributed on the radiation exit side in such a way that the area is uniformly and homogeneously illuminated. In each case essentially the same radiation power advantageously impinges on different, identically sized and illuminated regions of the area.

Radiation emerging via the concave partial region 121 is scattered in a manner similar to that in the case of a diverging lens. In particular, radiation impinging on the radiation exit area 20 at an angle with respect to the optical axis that differs from 90° is refracted away from the optical axis there. The radiation emerging via the concave partial region serves for homogeneously illuminating a region of the area 23 that surrounds the optical axis 21.

Regions of the area 23 that are spaced apart comparatively far from the optical axis are illuminated by means of radiation that emerges from the beam shaping part via the convexly curved partial region 122—at an angle with respect to the optical axis 21 that differs from 90°.

The transition region between the concave and convex partial regions is preferably formed smoothly, in particular in a manner free of edges. In particular, the radiation exit area can be embodied in differentiable fashion, preferably over the whole area. Homogeneous illumination of the area 23 is thus facilitated. None-differentiable bends would increase the risk of undesirable inhomogenities arising in the radiation power distribution from the area 23 to be illuminated.

The convexly curved partial region 122 of the radiation exit area 20 preferably contains a larger area than the concavely curved partial region 121. Consequently, in comparison with the concavely curved partial region, an increased proportion of radiation emerges from the beam shaping part via the convexly curved partial region laterally and obliquely with respect to the optical axis.

Furthermore, the convexly curved partial region 122 preferably has a first region 24 having a first curvature and a second region 25 having a second curvature, which differs from the first curvature.

In this case, the first curvature is preferably smaller than the second curvature. On account of the larger curvature in the second region 25, radiation emerging from the beam shaping part in this region advantageously has a larger angle with respect to the optical axis 21 than radiation emerging from the beam shaping part in the first region 24 or in the concave partial region 121. The homogeneous illumination of regions of the area 23 that are comparatively far away from the optical axis is thus facilitated.

Preferably, radiation emerges from the optical element from the beam shaping part 12 essentially only at an angle of less than 90 degrees with respect to the optical axis. The emission therefor runs principally in particular laterally or transversely with respect to the optical axis and forward in the direction of the optical axis. The beam shaping part 12 is preferably embodied in such a way that a large part of the radiation power, preferably 60% or more, emerges from the beam shaping part at an angle with respect to the optical axis, in particular greater than 60° and/or via the convexly curved partial region 122.

The curvature of the convex partial region 122 can increase with increasing distance from the concavely curved partial region, in particular in the second region 25 in the direction of the radiation entrance area 22, thereby fostering an increased coupling out of radiation at large angles with respect to the optical axis and hence the illumination of regions of the area 23 that are comparatively far away from the optical axis.

The beam shaping part 12 can be embodied in such a way that beams emerging from the beam shaping part do not overlap, such that the local radiation power distribution on the area to be illuminated is essentially independent of the distance of the area from the beam shaping part.

If the beam shaping part caused a crossover of beams during beam shaping, then a focal region could form, such that the local radiation power distribution on the area 23 would be dependent on the distance of the area from the beam shaping part. In particular, inhomogenities, for instance rings of higher intensity, in the local radiation power distribution would form in the case of a variation of the distance of the area 23 from the beam shaping part. Said inhomogenities are brought about by crossover of beams. In the beam shaping part 12 illustrated, however, by virtue of the avoidance of beam crossover intersections, the local distribution of the radiation power on the area 23 is independent of the distance of the area from the radiation exit area. Furthermore, the beam shaping or the beam guiding in the beam shaping part is preferably effected in a manner free of total reflection.

The emission characteristic of the semiconductor chip can be widened by means of the beam shaping part, such that that partial region of the area which is to be illuminated by means of the semiconductor chip is enlarged in comparison with direct illumination by means of the semiconductor chip at a predetermined distance of the semiconductor chip from the area. As an alternative, in the case of an area to be illuminated which has a predetermined size, the semiconductor chip can advantageously be arranged closer to the area to be illuminated, on account of the beam shaping in the beam shaping part.

For an emission characteristic of the illumination device that is uniform in a manner running azimuthally about the optical axis 21, the radiation exit area 20, in particular the entire beam shaping part, is preferably embodied rotationally symmetrically with respect to the optical axis. In regions not provided for the beam shaping, it is possible to depart from the rotationally symmetrical embodiment, if appropriate.

Figure 4:
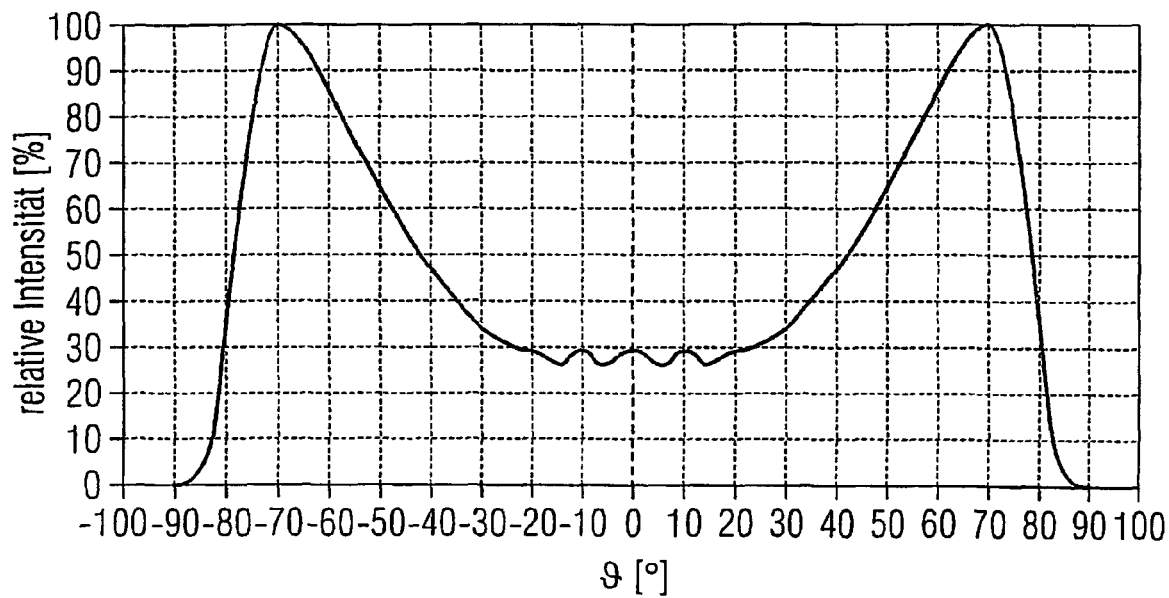
FIG. 4 shows an emission characteristic of the arrangement shown in FIG. 3, FIGS. 5A to 5C show different schematic views of an exemplary embodiment of an optical element comprising a carrier part and a beam shaping part.

FIG. 4 shows an example of an emission characteristic of the arrangement shown in FIG. 3 after the beam shaping at the beam shaping part. The relative intensity in percent is plotted as a function of the angle θ in ° with respect to the optical axis.

The emission characteristic shown here was determined for a beam shaping part in accordance with FIG. 3 embodied rotationally symmetrically with respect to the optical axis, and a semiconductor chip that was arranged at a distance of 0.6 mm from the radiation entrance area 22.

The arrangement emits a large part of the radiation power laterally with respect to the optical axis, in particular at comparatively large angles. Preferably, a local minimum of the characteristic lies in the region of the concavely curved partial region, in particular within the concavely curved partial region and/or in the angle range of between 0° and 10°.

Furthermore, the arrangement emits preferably more than 50%, particularly more than 60%, of the radiation power generated by the semiconductor chip into an angle range of between 80° and 40° with respect to the optical axis.

The maximum of the intensity is at an angle of greater than 60°, in particular at approximately 70°. Proceeding from the concave partial region, which corresponds to the region around 0°, the intensity grows as the angle increases, that is to say in the direction of the convexly curved partial region, approximately in accordance with a power function, in particular in accordance with a parabola, and falls steeply after reaching the maximum.

FIGS. 5A to 5C and 6A to 6C show different schematic views of an optical element 14 comprising a carrier part 1 and a beam shaping part 12.

The carrier part 1 in accordance with FIGS. 5A to 5C corresponds to the carrier part described in connection with FIGS. 1A to 1D, and the carrier part 1 in accordance with FIGS. 6A to 6C corresponds to the carrier part described in connection with FIGS. 2A to 2B. The beam shaping part 12 in each case essentially corresponds to the basic structure of the beam shaping part 12 described in connection with FIGS. 3 and 4.

Figure 5A:
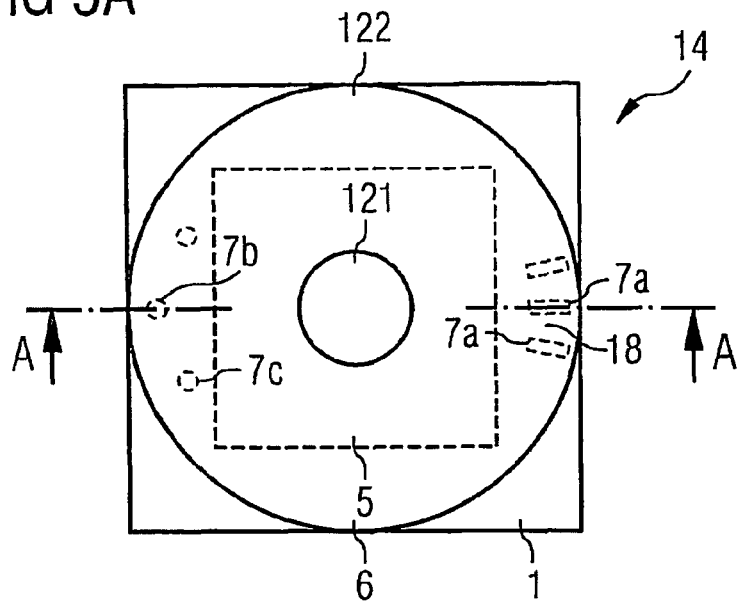
Figure 5B:
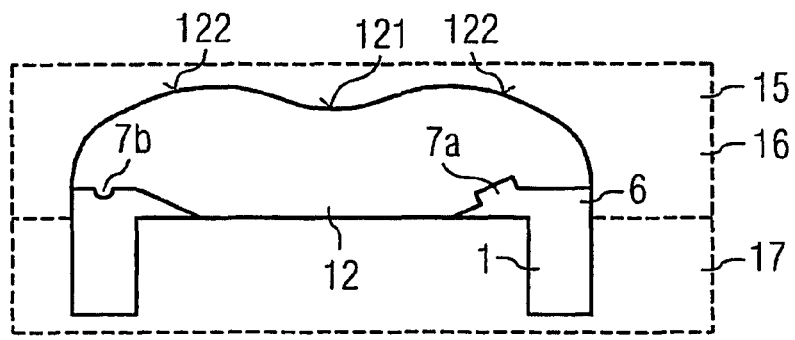
Figure 5C:
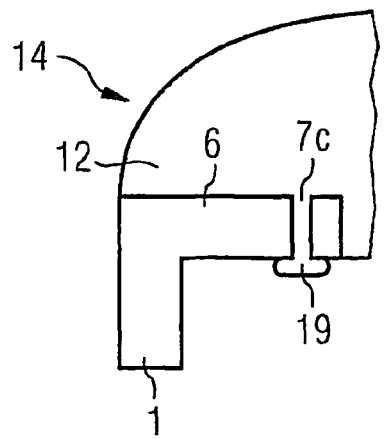

FIG. 5A shows a schematic plan view of the optical element 14 from above, FIG. 5B shows a schematic sectional view along the line A-A from FIG. 5A and FIG. 5C shows a schematic partial sectional view of the optical element 14.

Figure 6A:
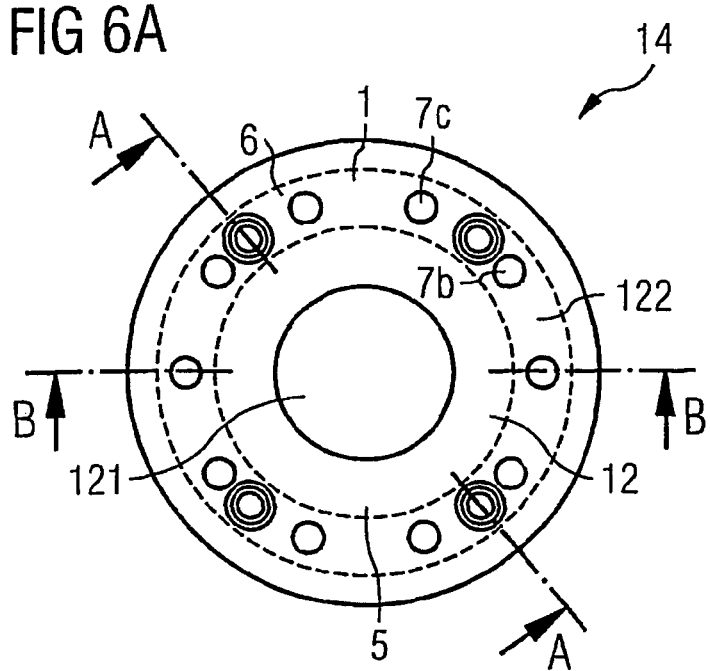
FIGS. 6A to 6C show different schematic views of a further exemplary embodiment of an optical element comprising a carrier part and a beam shaping part.
Figure 6B:
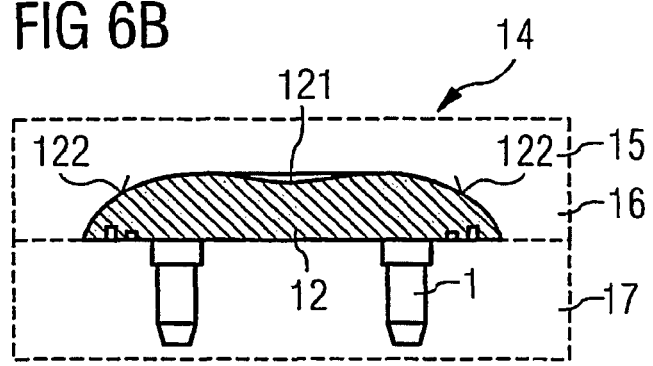
Figure 6C:
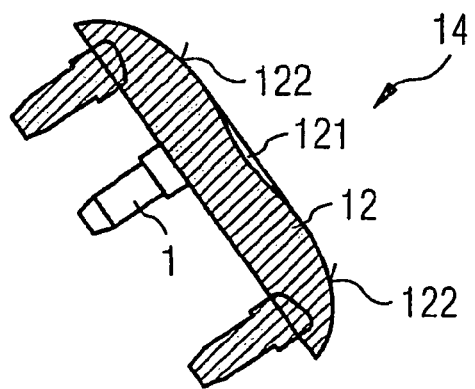

FIG. 6A shows a schematic plan view of the optical element 14 from above, FIG. 6B shows a schematic sectional view along the line B-B from FIG. 6A and FIG. 6C shows a schematic sectional view along the line A-A from FIG. 6A.

The optical elements 14 in accordance with FIGS. 5A to 5C and FIGS. 6A to 6C each have a carrier part 1 and a beam shaping part 12, wherein the beam shaping part 12 is molded onto the carrier part. The beam shaping part 12 contains a plastic, for instance a silicone or a silicone hybrid material, or consists of that. Said plastic differs from the basic molding compound for the carrier part 1.

The molding on is preferably effected by means of a molding method, for example an injection-molding method. For this purpose, the, preferably fully cured, carrier part 1 produced first is introduced into a mold 15 shaped for the beam shaping part 12, whereupon a different molding compound than the molding compound used for the carrier part 1, for instance a silicone or a silicone hybrid molding compound, for the beam shaping part is molded, in particular injection-molded, onto the carrier part. The molding compound is preferably injection-molded onto the carrier part 1. The mold 15 having the partial molds 16 and 17, which form a cavity for the beam shaping part, is illustrated only schematically and by dashed lines in FIGS. 5B and 6B.

The flowable molding compound for the beam shaping part that is filled into the mold molds onto the carrier part 1 and in particular onto the connecting elements 7a, 7b and 7c formed at the molding-on part 6. The molding compound is subsequently fully cured, in particular in temperature-assisted fashion, for instance by cooling, and/or by crosslinking. The molding compound preferably contracts during curing, such that a mechanically stable connection between the carrier part 1 and the beam shaping part 12 is formed without an adhesion promoter additionally being used. The beam shaping part is preferably under tensile stress. The flexibility of an actually flexible material, such as a silicone or a silicone hybrid material, for the beam shaping part can thus be reduced. The beam shaping part can then advantageously be bent only with a higher expenditure of force by comparison with an optical element that only has the material of the beam shaping part, and has an increased stability.

By means of a two-component injection-molding method with two different molds and molding compounds, the carrier part 1 and the beam shaping part 12 can be optimized toward the respective primary function—mechanical stability for the carrier part and optical properties for the beam shaping part—in a simplified manner.

After curing, the optical element is removed from the mold 15.

If appropriate, a carrier part 1 can also be molded onto a corresponding premolded beam shaping part 12. However, since the carrier part 1 preferably ensures the mechanical stability of the beam shaping part, an opposite procedure is preferred.

If appropriate, the beam shaping part can also be molded onto the carrier part in a common mold. On account of the more exact shaping possibilities, manufacture in two separate molds is preferable to that.

The formation of a mechanically stable, in particular intimate connection between the carrier part 1 and the beam shaping part 12 is promoted by the connecting element 7a, 7b and 7c, respectively. Said connecting elements are illustrated schematically and in detail only in FIGS. 5A to 5C, but can also be provided in a corresponding manner in the case of the optical element 14 shown in FIGS. 6A to 6C.

The connecting elements 7a, which are embodied as elevation, have the beam shaping part 12 molded around. Preferably, the lateral extent of an interspace 18 between the connecting elements, which interspace is laterally delimited by means of two adjacent connecting elements 7a, decreases in the direction of the aperture 5. Upon curing of the beam shaping part 12, the tensile stress and by means of this the stability of the beam shaping part and also the mechanical linking thereof to the carrier part 1 can be increased in a simplified manner.

The beam shaping part 12 is molded into the connecting element 7b, which is embodied as depression. The beam shaping part 12 engages in particular into the carrier part 1. The mechanical stability for the connection, in the same way as the tensile stress on the beam shaping part, can also be increased by means of the connecting element 7b.

The connecting element 7c, which is formed as a continuous cutout in the molding-on part 6, is molded through during the molding-on process, wherein a rivet-like protuberance or bulge 19 is formed on that surface of the carrier part 1 which is remote from the beam shaping part 12. The mechanical stability of the connection of carrier part and beam shaping part 12 can also be increased by means of a connecting element 7c of this type.

The aperture 5 of the carrier part 1 is in each case completely covered by the beam shaping part 12. The beam shaping surface—remote from the carrier part 1—of the beam shaping part 12 with the concavely curved partial region 121 and the convexly curved partial region 122 can thus advantageously be formed in large-area fashion. Large-area illumination of an area is thus simplified.

The concavely curved partial region 121 is preferably arranged above a central region of the aperture 5. A projection of the concavely curved partial region 121 into the aperture 5 preferably lies completely within the aperture.

The beam shaping part 12 can project laterally beyond the carrier part 1. This increases that surface of the beam shaping part which is remote from the carrier part, whereby the radiation passage area can be enlarged. In order to increase the mechanical support of the beam shaping part, however, the beam shaping part can terminate laterally flush with the carrier part, if appropriate, or the carrier part can project laterally beyond the beam shaping part.

Figure 7A:
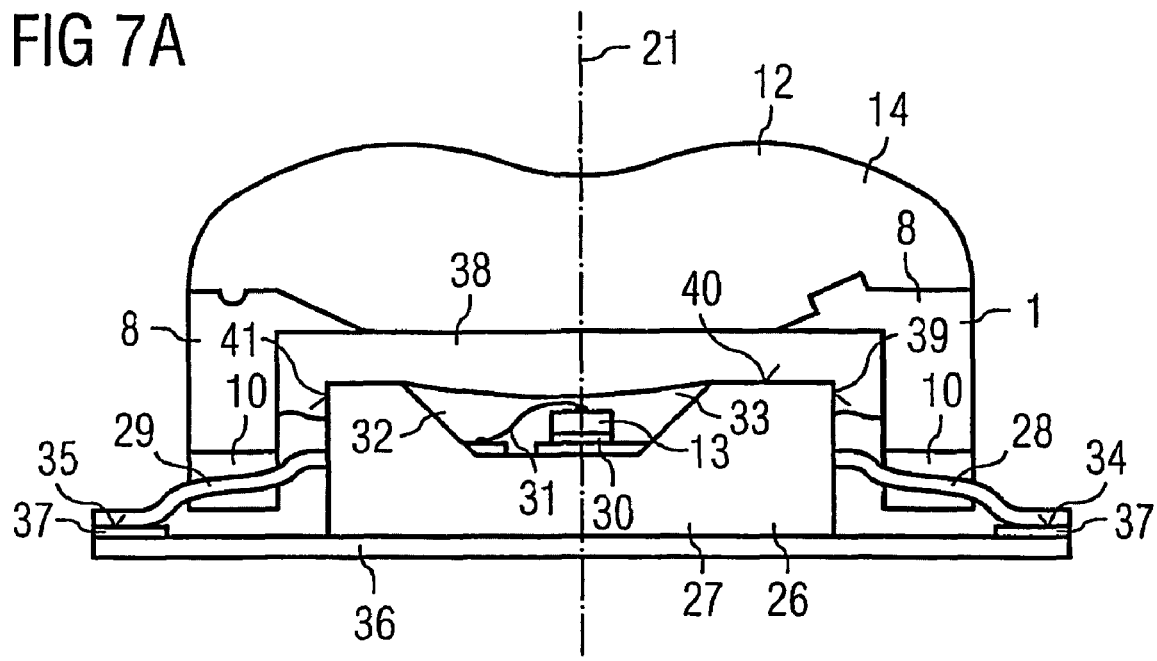
FIGS. 7A and 7B show schematic views of an exemplary embodiment of a composite device comprising an optical element fixed to an optoelectronic component.
Figure 7B:
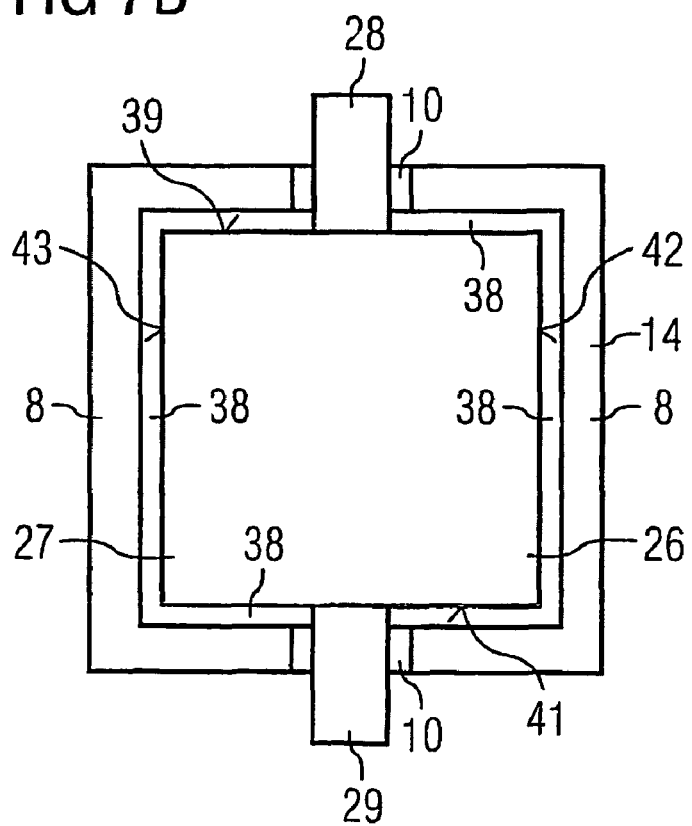
Figure 8:
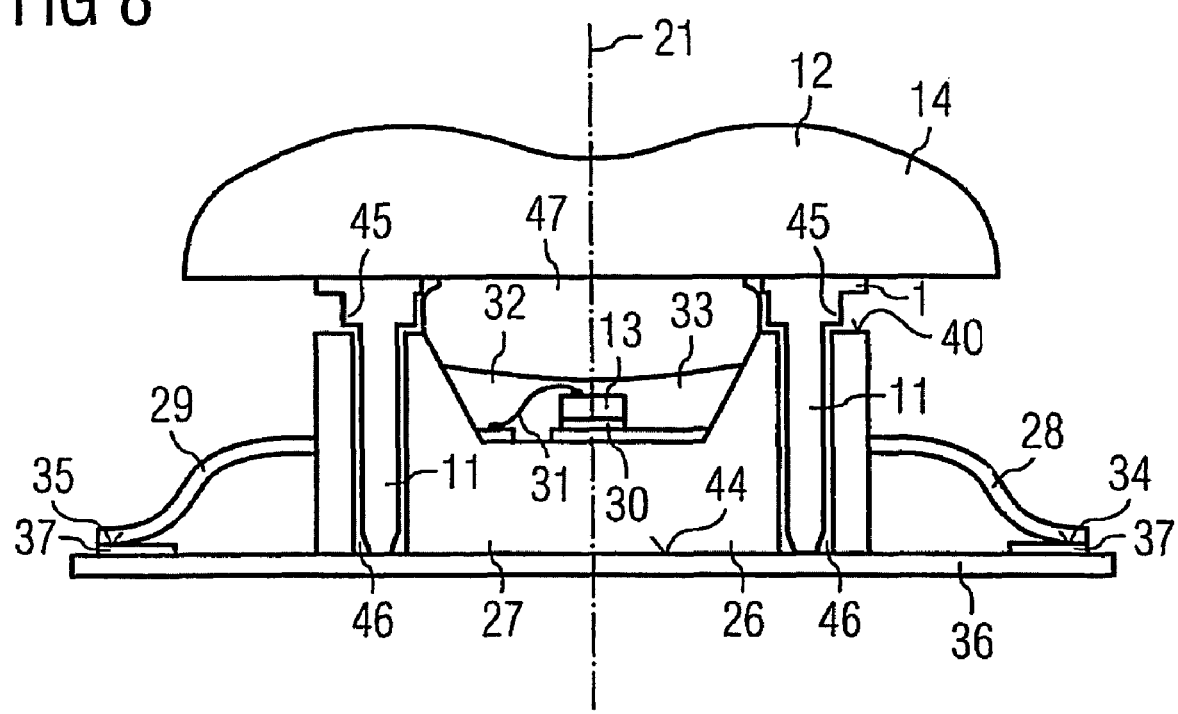
FIG. 8 shows a schematic sectional view of a further exemplary embodiment of a composite device comprising an optical element fixed to an optoelectronic component.

FIGS. 7A to 7B and 8 illustrate optical elements 14 which are fixed to an optoelectronic component 26. In this regard, FIG. 7A shows a schematic sectional view, FIG. 7B shows a schematic plan view from below, and FIG. 8 shows a schematic sectional view in each case of a composite device of this type.

The optical element 14 in accordance with FIGS. 7A to 7B corresponds to the optical element described in connection with FIGS. 5A to 5C, and the optical element in accordance with FIG. 8 corresponds to the optical element described in connection with FIGS. 6A to 6C.

The optoelectronic component 26 in each case has a housing body 27 and an optoelectronic semiconductor chip 13, in particular for generating radiation. The optoelectronic component 26 furthermore has a first electrical connection conductor 28 and a second electrical connection conductor 29. These preferably project from the housing body 27 at different lateral areas, in particular opposite lateral areas, of said housing body. The connection conductors serve for making electrical contact with the semiconductor chip 13 and are expediently electrically conductively connected to the latter for this purpose. The semiconductor chip 13 can be electrically conductively connected to the first connection conductor 28, and/or fixed on the latter, by means of a connection layer 30, for instance an electrically conductive adhesive layer or a solder layer. The semiconductor chip is electrically conductively connected to the second connection conductor 29 preferably by means of a bonding wire 31.

The optoelectronic component 26, in particular the housing body 27, can be produced by means of the encapsulation by molding, for instance by means of an injection-molding, transfer-molding or compression-molding method, of a leadframe comprising the two connection conductors 28 and 29 with a suitable molding compound, for instance a plastic material, in particular a thermoplastic, e.g. PPA. The semiconductor chip 13 can subsequently be electrically conductively connected to the connection conductors. The optoelectronic component can accordingly have a premolded housing, a so-called premolded package.

The housing body 27 preferably has a cavity 32, in which the semiconductor chip 13 is particularly preferably arranged. Furthermore, an encapsulation compound 33 can be arranged in the cavity 32, the semiconductor chip 13 and preferably also the bonding wire being embedded into said encapsulation compound. This encapsulation advantageously protects the semiconductor chip 13 and the bonding wire 13 against harmful external influences. The encapsulation is expediently formed such that it is radiation-transmissive to radiation that is to be generated or to be received in the semiconductor chip 13.

By way of example, the encapsulation contains a silicone or a silicone hybrid material. These materials are distinguished by high stability in the optical properties, for instance transmission, over a crucial irradiation duration with respect to high-energy short-wave, e.g. blue or ultraviolet radiation which the semiconductor chip can preferably generate.

The optoelectronic component can furthermore be formed for generating mixed-colored, in particular white light. For this purpose, a wavelength conversion material is disposed downstream of the semiconductor chip, for instance in the encapsulation compound. Part of the radiation generated by the semiconductor chip can excite the wavelength conversion material, for instance a phosphor, in particular in particle form, to emit longer-wave radiation. From the mixture of the radiation generated by the semiconductor chip and the radiation reemitted by the wavelength conversion material, mixed-colored, in particular white, light can consequently arise. A primary radiation generated by the semiconductor chip 13 in the blue spectral range and a radiation reemitted by the wavelength conversion material in the yellow spectral range are particularly suitable for generating white light.

The housing body 27 is preferably produced from a highly reflective material, for instance a white plastic, e.g. PPA. Alternatively or supplementarily, the walls of the cavity 32 can be coated with a reflection-increasing material, for instance a metal, in order to increase the reflection of a radiation generated by the semiconductor chip at the wall of the cavity. By means of reflection at the wall of the cavity, the proportion of the radiation fed to the optical element 14 for beam shaping can advantageously be increased compared with a housing or a housing body without a cavity 32.

The optoelectronic component is furthermore preferably formed in surface-mountable fashion (SMD: Surface Mountable Device). In the course of surface mounting, for example the connection conductors 28 and 29 are soldered by way of soldering areas 34 and 35, respectively, of the connection conductors onto external electrical connection means (not illustrated) of a connection carrier 36, e.g. the conductor tracks of a printed circuit board. In this case, the optoelectronic component is arranged on the connection carrier, wherein the connection conductors are soldered to the external electrical connection means by means of a solder 37 at high temperatures of, for example, 250° C. or higher, in particular with melting of the solder.

It should be noted that the housing can also be embodied as a so-called overmold housing or as a housing of a radial LED, in which the housing material is continuously molded around the chip and the connection conductors after the chip has been mounted on the connection conductors. The material of the housing body is expediently chosen to be radiation-transmissive for the passage of radiation. In contrast to overmold designs, radial designs are not suitable for surface mounted technology (SMT). Premolded housing designs are furthermore particularly suitable for high-power components for generating high radiation powers, since a transparent housing body material can be dispensed with. The degrees of freedom for the selection of the material are thus increased. In conventional optical elements fixed to a component there is the increased risk of the optical elements being deformed or even melting during the soldering operation, owing to the temperature, or of the fixing of the optical element to the component becoming detached. The emission characteristic of such a conventional composite device can thus be crucially impaired. Pure thermoplastic lenses composed of a radiation-transmissive thermoplastic are not dimensionally stable for example at soldering temperatures of above 250° C. and start to melt or even melt altogether. In the case of lenses composed of silicone there is a considerable risk of the fixing to the component becoming detached during the soldering operation.

The composite device comprising the optoelectronic component 26 and the optical element 14 fixed thereto, on account of the simplified optimization of the carrier part 1 and the beam shaping part 12 toward different functions, is embodied such that it can advantageously be soldered reliably by means of a lead-free soldering process in which a lead-free solder is expediently used.

A plastic distinguished by high mechanical stability, good fixing properties and/or matching of the coefficient of thermal expansion to that of the housing is preferably used for the carrier part 1. A radiation-opaque thermoplastic or a possibly radiation-opaque thermosetting plastic is particularly suitable for the carrier part. Particularly advantageously, the carrier part has the same material composition as the housing body 27 and contains or consists of PPA, for example.

The beam shaping part 12 preferably contains a silicone or a silicone hybrid material or consists of a material of this type. Although these materials are distinguished by good radiation and temperature stability, they are also not able, or only able with difficulty, to be permanently mechanically stably fixed to the component owing to the easy bendability of said materials.

Molding the carrier part 1 and the beam shaping part 12 onto one another facilitates the formation of an adhesion-promoting-free, intimate and mechanically stable linking of the beam shaping part to the carrier part, wherein the parts can contain materials that are fundamentally different from one another. The optical element can be embodied integrally despite individual parts composed of different materials in this sense.

During a typical lead-free soldering process at a soldering temperature of approximately 260° C., a composite device comprising such an optimized optical element composed of different materials is stable over the soldering duration of 120 s, for example, both with regard to the fixing of the optical element to the component and with regard to the form of the beam shaping part and the beam shaping properties.

The composite devices shown in FIGS. 7A to 7B and 8 differ in the way in which the optical element 14 is fixed to the optoelectronic component 26.

The optical element 14 of the composite device shown in FIGS. 7A to 7B is slipped over the optoelectronic component 26 or the optoelectronic component is inserted into the optical element. In this case, the optical element and the component are oriented relative to one another in such a way that the connection conductors 28 and 29 run via the region of the recesses 10 in the fixing part 8 of the carrier part to outside that region of the component 26 which is covered by the optical element, or are correspondingly led through said recesses.

The fixing is essentially effected by means of an adhesion promoting layer 38, which is arranged between the optical element and the component and, preferably over the whole area, in particular over its entire extent, adjoins the optoelectronic component and the optical element, in particular the beam shaping part 12 and the carrier part 1.

The adhesion promoting layer 38 preferably extends, proceeding from a lateral area 39 that laterally delimits the optoelectronic component, in particular an outermost lateral area of the housing body 27, along the fixing part 8 as far as and along that surface of the component, in particular of the housing body, which faces the beam shaping part 12. In the further course, the layer 38 extends continuously along the encapsulation 33, whose surface remote from the semiconductor chip in the present case forms the radiation passage area of the component, and up to and along the lateral area 41 of the optoelectronic component opposite the starting lateral area. Preferably, the layer 38 is arranged at two further, in particular opposite, lateral areas 42 and 43 of the optoelectronic component, wherein the course of the layer preferably corresponds to that described above.

Preferably, the layer 38 contains a silicone, in particular a silicone gel, or a silicone hybrid material, or consists of that. These materials, in particular a silicone gel, are distinguished by good adhesion promotion, in particular between the materials that can be used for the housing body and the carrier part and were mentioned further above. Furthermore, these materials are also suitable for the refractive index matching of the beam shaping part 12 to the radiation-transmissive encapsulation material 33. Refractive index matching can be effected particularly efficiently if the encapsulation material, the beam shaping part and the adhesion promoting layer 38 each contain a silicone or, if appropriate, a silicone hybrid material.

By means of the adhesion promoting layer 38 it is furthermore possible to reduce the flexibility of the beam shaping part or increase the strength.

The carrier part 1, in particular the fixing part 8 thereof, and/or the adhesion promoting layer 38 preferably engage around the housing body 27 and particularly preferably run laterally, in particular completely, around said housing body. Furthermore, the fixing part can be laterally spaced apart from the housing body over a large area, in particular completely. The fixing part can engage around or, in particular completely, run around an outermost lateral area of the housing body laterally at a distance.

The encapsulation 33 is furthermore preferably completely covered with the layer 38. A reliable optical linking of the optical element, both from an optical standpoint with a small jump in refractive index, and from a mechanical standpoint with a large adhesion promoting area, can thus be obtained in an advantageously simple manner. In particular, additional mounting devices, for instance latching devices or the like, formed in the optoelectronic component can be dispensed with.

The optical element can be fixed in particular exclusively at the lateral area(s) of the housing body and/or of that surface of the component and in particular of the housing body which faces the beam shaping part.

The carrier part 1 and in particular the fixing part 8 preferably delimits and/or borders a well- or trough-like recess in the optical element, into which the component can be inserted. Prior to the insertion, said recess can be filled with a predetermined amount of material for the layer 38. Afterward, the component can be inserted and the material can be incipiently or fully cured, for instance by means of crosslinking. The amount of material is preferably chosen such that the layer 38 of the optical element that forms remains within the optical element and, in particular proceeding from the optical element, does not run beyond the carrier part 1.

In the case of the composite device shown schematically in FIG. 8, the optical element 14 is plugged onto the optoelectronic component and fixed to the component by means of a plurality of fixing elements 11. For this purpose, the fixing elements 11 engage into mounting devices 46 of the optoelectronic component 26, said mounting devices being formed in particular as recesses or cutouts in the housing body 27. The mounting devices preferably run into the housing body proceeding from the surface 40 facing the beam shaping part 12 and are in particular laterally circumferentially delimited by the housing body. Particularly preferably, the mounting devices run continuously as far as a surface 44 of the housing body 27 that is opposite the surface 40 and is remote from the beam shaping part 12.

By means of spacers 45 which are formed at or in the carrier part 1, in particular the fixing elements 11, and are embodied for instance in each case as a projection of the corresponding fixing element 11, it is possible to comply with a predetermined distance between the beam shaping part 12 and the semiconductor chip 13 in a simplified manner. For this purpose, the spacers 45 are preferably seated on the optoelectronic component 26, in particular the housing body.

The fixing of the optical element 14 to the optoelectronic component 26 can be effected by means of the fixing elements for example by means of an adhesive arranged within the mounting device, a press fit, a hot press fit, a thermal riveting, caulking or hot caulking.

A refractive index matching layer 47 is arranged between the beam shaping part 12 and the encapsulation 33 and in particular the semiconductor chip 13, which layer contains a silicone gel, for instance but in the present case is not or not crucially involved in the fixing.

An optoelectronic component that is particularly suitable for a composite device, for instance in accordance with FIGS. 7A to 7B or FIG. 8, in particular for generating high radiation power, is described in more detail in WO 02/084749, the disclosure content of which is hereby explicitly incorporated by reference in the present application. Said component has, besides the electrical connection conductors, a thermal connection conductor for dissipating the possibly considerable heat loss. Said thermal connection conductor can be soldered separately and, for the heat dissipation, is preferably embodied in large-area fashion, in particular as seen in comparison with the soldering areas of the connection conductors. A particularly soldering-stable optical element as described above is therefore particularly advantageous for a composite device comprising said component, on account of the enlarged soldering area.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

The invention claimed is:

1. An optical element, suitable for an optoelectronic component, the optical element comprising a carrier part and a beam shaping part,
    wherein the beam shaping part is molded onto the carrier part, or vice versa; and
    wherein at least one of:
        the carrier part contains one of the following plastics: a thermoplastic, a thermosetting plastic; and
        the beam shaping part contains one of the following plastics: a silicone, a hybrid material, and a silicone hybrid material.

2. The optical element as claimed in claim 1, wherein the beam shaping part and the carrier part contain mutually different materials.

3. The optical element as claimed in claim 1, wherein the carrier part contains one of the following plastics: a thermoplastic, a thermosetting plastic; and wherein the beam shaping part contains one of the following plastics: a silicone, a hybrid material, and a silicone hybrid material.

4. The optical element as claimed in claim 1, wherein the beam shaping part and the carrier part contain mutually different plastics.

5. The optical element as claimed in claim 1, further comprising at least one connecting element formed at or in the carrier part, wherein the beam shaping part at least one of partly molds around, is molded into, and is molded through the at least one connecting element.

6. The optical element as claimed in claim 1, further comprising at least one fixing element formed at or in the carrier part, wherein the optoelectronic component has further comprising at least one mounting device, which corresponds to the at least one fixing element and into which the at least one fixing element engages for fixing the optical element to the optoelectronic component.

7. An optical element, suitable for an optoelectronic component, the optical element comprising a carrier part and a beam shaping part,
    wherein the beam shaping part and the carrier part contain mutually different materials; and
    wherein the carrier part contains one of the following plastics: a thermoplastic, a thermosetting plastic.

8. The optical element as claimed in claim 7, wherein the beam shaping part is molded onto the carrier part, or vice versa.

9. The optical element as claimed in claim 7, wherein the beam shaping part and the carrier part are formed from mutually different basic materials.

10. The optical element as claimed in claim 7, wherein the beam shaping part and the carrier part contain mutually different plastics.

11. The optical element as claimed in claim 7, wherein the beam shaping part contains one of the following plastics: a silicone, a hybrid material, and a silicone hybrid material.

12. The optical element as claimed in claim 7, wherein the beam shaping part is mechanically stably connected to the carrier part.

13. The optical element as claimed in claim 7, wherein the beam shaping part laterally covers an aperture of the carrier part.

14. The optical element as claimed in claim 7, which is formed for fixing to the optoelectronic component or is fixed to the component.

15. The optical element as claimed in claim 7, which is formed as attachment optic for attachment onto the optoelectronic component.

16. The optical element as claimed in claim 7, wherein the carrier part is produced from a material that is radiation-opaque to a radiation to be received and/or to be generated in the optoelectronic component.

17. The optical element as claimed in claim 7, wherein one or a plurality of fixing elements is or are formed at or in the carrier part, wherein the optoelectronic component has one or a plurality of mounting devices which correspond to the fixing elements and into which the fixing elements engage for fixing the optical element to the optoelectronic component.

18. A composite device comprising an optoelectronic component and an optical element as claimed in claim 7, said optical element being fixed to said component.

19. The optical element as claimed in claim 7, wherein the beam shaping part and the carrier part are formed from mutually different basic molding compounds.

20. The optical element as claimed in claim 7, which has a connecting element or a plurality of connecting elements formed at or in the carrier part, wherein the beam shaping part at least partly molds around the connecting element or the connecting elements, is molded into the connecting element or the connecting elements and/or is molded through the connecting element or the connecting elements.

21. The optical element as claimed in claim 20, wherein the connecting element or the connecting elements has or have one or a plurality of the following configurations: elevation, depression, cutout.

22. The optical element as claimed in claim 7, wherein the optoelectronic component has a housing body with a radiation passage area and the optical element is fixed to the housing body.

23. The optical element as claimed in claim 22, wherein the optical element is fixed to the housing body by means of the carrier part.

24. The optical element as claimed in claim 22, wherein the carrier part and the housing body are matched to one another with regard to coefficients of thermal expansion of the carrier part and the housing body.

25. The optical element as claimed in claim 22, wherein the carrier part and the housing body contain an identical material or have an identical material composition.

26. The optical element as claimed in claim 11, wherein the carrier part engages over the housing body.

27. The optical element as claimed in claim 22, which is slipped over the housing body.

28. The optical element as claimed in claim 22, wherein the carrier part runs laterally around the housing body.

29. The optical element as claimed in claim 22, wherein the optical element is fixed, from outside the housing body, to a lateral area that laterally delimits the housing body.

30. The optical element as claimed in claim 7, wherein the optical element is fixed to the optoelectronic component by means of an adhesion promoter.

31. The optical element as claimed in claim 30, wherein the optoelectronic component has a housing body with a radiation passage area, and wherein the adhesion promoter is arranged between the carrier part and the lateral area of the housing body.

32. The optical element as claimed in claim 30, wherein the optoelectronic component has a housing body with a radiation passage area, and wherein the adhesion promoter extends along a surface of the housing body that faces the beam shaping part, and, proceeding from said surface, extends as far as and along the lateral area.

33. The optical element as claimed in claim 30, wherein the optoelectronic component has a housing body with a radiation passage area, and wherein the adhesion promoter, proceeding from the radiation passage area of the housing body, extends as far as and along the lateral area.

34. The optical element as claimed in claim 30, wherein the optoelectronic component has a housing body with a radiation passage area, and wherein the adhesion promoter forms a refractive index matching layer arranged between the beam shaping part and the radiation passage area of the housing body.

35. The optical element as claimed in claim 30, wherein the adhesion promoter comprises a silicone, a silicone gel, or a silicone hybrid material.

36. An optical element, suitable for an optoelectronic component, the optical element comprising a carrier part and a beam shaping part,
 wherein the beam shaping part and the carrier part contain mutually different materials; and
 wherein the beam shaping part contains one of the following plastics: a silicone, a hybrid material, and a silicone hybrid material.

37. The optical element as claimed in claim 36, wherein the beam shaping part and the carrier part contain mutually different plastics.

38. The optical element as claimed in claim 36, further comprising at least one connecting element formed at or in the carrier part, wherein the beam shaping part at least one of partly molds around the at least one connecting element, is molded into the at least one connecting element, and is molded through the at least one connecting element.

39. The optical element as claimed in claim 36, further comprising at least one fixing element formed at or in the carrier part, wherein the optoelectronic component has at least one mounting device, which corresponds to the at least one fixing element and into which the at least one fixing element engages for fixing the optical element to the optoelectronic component.

* * * * *